United States Patent
Ooshita et al.

(10) Patent No.: US 7,112,989 B2
(45) Date of Patent: Sep. 26, 2006

(54) TRANSMISSION SIGNAL CORRECTION CIRCUIT

(75) Inventors: Takeshi Ooshita, Tokyo (JP); Katsushi Asahina, Tokyo (JP); Takuji Komeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 111 days.

(21) Appl. No.: 10/912,568

(22) Filed: Aug. 6, 2004

(65) Prior Publication Data
US 2005/0068060 A1    Mar. 31, 2005

(30) Foreign Application Priority Data
Aug. 7, 2003    (JP) .............................. 2003-289229

(51) Int. Cl.
*H03K 17/16* (2006.01)
*H03K 19/094* (2006.01)

(52) U.S. Cl. ..................... 326/27; 326/87; 327/112

(58) Field of Classification Search .............. 326/21, 326/26, 27, 28, 29, 83, 87; 327/112, 170
See application file for complete search history.

(56) References Cited

U.S. PATENT DOCUMENTS

| 6,262,607 B1 * | 7/2001 | Suzuki ..................... 327/112 |
| 6,518,792 B1 | 2/2003 | Jong et al. |
| 2003/0193351 A1 * | 10/2003 | Fukui ......................... 326/83 |

FOREIGN PATENT DOCUMENTS

| JP | 11-345054 | 12/1999 |
| JP | 2002-368600 | 12/2002 |

* cited by examiner

*Primary Examiner*—Daniel Chang
(74) *Attorney, Agent, or Firm*—McDermott Will & Emery LLP

(57) ABSTRACT

In a transmission signal correction circuit, a first output circuit outputs a data string to outside. A second output circuit for correction is connected in parallel with the first output circuit. The second output circuit receives the data string to add the data string to an output signal of the first output circuit during a period when a control signal is kept generated. A data string detection circuit generates the control signal when detecting a signal sequence, in the data string, that affects a transmission waveform.

18 Claims, 14 Drawing Sheets

BEFORE AMPLITUDE
CORRECTION

AFTER AMPLITUDE
CORRECTION

BEFORE DELAY CORRECTION

AFTER DELAY CORRECTION

TRANSMISSION SIGNAL CORRECTION CIRCUIT

BACKGROUND OF THE INVENTION

1) Field of the Invention

The present invention relates to a transmission signal correction circuit.

2) Description of the Related Art

There has been a rapid increase in operation frequencies of large scale integrations (LSI). This has been made possible by increasing the speed of signal transmission between LSIs.

Some of the LSIs employ a parallel transmission scheme when performing transmission between LSIs. In such LSIs, since there is less space for interconnect on a system board, skew is produced between bits so that the operation frequency can not be increased much. One approach to solve this problem is to reduce the number of parallel signal lines and, on the other hand, increase the transfer rate per bit. This approach makes it possible to largely increase data transfer rate of each bit. However, there is a drawback in this approach that an input waveform becomes dependent on a data series called inter symbol interference (ISI) on its reception side and causes degradation in signal quality. Means and measures that can take care of this drawback are being researched.

The ISI are explained below with reference to FIG. 20 to FIG. 23. FIG. 20 is a conceptual diagram for explaining attenuation characteristics of substrate interconnect. FIG. 21 is a conceptual diagram of digital signal waveforms that are transmitted through the substrate interconnect. FIG. 22 is a conceptual diagram of reduced eye patterns due to the ISI. FIG. 23 is a conceptual diagram of effects obtained when waveforms are controlled on their transmission side.

As shown in FIG. 20, the signal loss becomes enormous on a system board during high-speed data transmission exceeding 1 gigahertz (GHz). As a result, when a data series is an alternate pattern between high (H) level and low (L) level, amplitudes and times are aligned as shown with (a) in FIG. 21. However, when a bit pattern is, for example, "HLLHLH", the amplitude of the signal at "H" after "LL" may lower by a certain level 121 caused by the ISI, and the transmission time may delay by a certain time 122 as shown with (b) in FIG. 21.

Specifically, FIG. 22 depicts eye patterns obtained by overwriting the waveforms of FIG. 21 within one period. Amplitude 125 attenuates, and significant data time 126 reduces, which causes an opening of an eye to be made smaller and data identification to be difficult on its reception side. To suppress degradation in signal quality due to ISI, a method of controlling waveforms on the transmission side can be employed. According to this method, as shown in FIG. 23, by improving output amplitude 131 so as to increase reception amplitude, significant data period 132 is also improved.

Conventional devices for controlling waveforms are shown in FIG. 24 and FIG. 25. FIG. 24 is a circuit diagram of a simplified pre-emphasis circuit disclosed in Japanese Patent Application Laid Open (JP-A) No. 2002-368600 (see [0009] to [0013], FIG. 1 and FIG. 2). In this circuit, source electrodes of a differential pair of transistors 141 and 142 to which differential signals (input 1, input 2) are input are connected to power sources Vdd through respective loads 143 and 144. Commonly connected drain electrodes thereof are connected to a low potential power source Vss through a current source 145. Differential outputs (output 1, output 2) are output from nodes between the source electrodes of the differential pair of transistors 141 and 142 and the loads 143 and 144, respectively.

A circuit for the outputs includes a serial circuit of a switch 146 and a current source 147 provided in parallel with the current source 145, and an edge detector 148 that on-off controls the switch 146. The edge detector 148 includes a delay circuit that adds a delay operation to the input signal 1 as one of the differential input signals, and an exclusive OR (XOR) circuit that logically XORs the input signal 1 with the output of the delay circuit and provides a switch control signal to the switch 146.

When polarities of the output data are switched, the edge detector 148 asynchronously generates narrow pulse signals with a pulse width determined by a delay value of the delay circuit. The switch 146 connects the current source 147 to the drain electrodes commonly connected to the differential pair of transistors 141 and 142 during a period when the edge detector 148 outputs pulse signals to allow a drive current to increase. Consequently, the current of the output circuit increases, so that the output amplitude increases. This makes it possible to correct the waveform on the reception side.

FIG. 25 is a block diagram of a simplified driver circuit for signal transmission disclosed in JP-A No. H11-345054 (see [0009], FIG. 2). The driver circuit includes a pre-circuit 151 that is an amplitude-variable type, and a data string detector 153 that can change output amplitude of the pre-circuit 151 according to a data string of input signals. The driver circuit also includes a final-stage output circuit 152 that amplifies the thus changed output amplitude of the pre-circuit 151 and outputs it, and the waveform is thereby corrected. A control function is defined as essential or recommended option in signal specification such as "PCI-Express™ base specification revision 1.0" and "Infini-Band™ Architecture specification volume 2 revision 1.0a".

In addition, as a method of controlling waveforms in a complementary metal oxide semiconductor (CMOS) circuit, U.S. Pat. No. 6,518,792B2 (see FIG. 6A) discloses a method of operating a CMOS output circuit for correction according to an input data string. The CMOS output circuit for correction is arranged in parallel with a CMOS output-circuit usually used, and a pre-emphasis circuit is provided in the input stage of both the CMOS circuits.

The method disclosed in JP-A No. 2002-368600 is designed for a current mode logic (CML) circuit and temporarily changes characteristics of a constant current source. However, this causes the quality of a differential output signal to degrade. Moreover, if an edge detector that detects a high-frequency component is used as a circuit that detects a data string to be corrected, effects due to correction are determined depending on a delay value in a delay circuit used in the edge detector. Therefore, a high-frequency component detected may fluctuate in response to a change in a delay value due to fluctuations in circuit features, which causes the effects due to correction to fluctuate. Furthermore, the method disclosed in JP-A No. 2002-368600 cannot be used in the CMOS circuit.

In the method disclosed in JP-A No. H11-345054, the CMOS circuit is used, but an intermediate voltage value is used to cause a through current to increase and current consumption to increase. Since the intermediate voltage is weak in noise, the operation of the circuit becomes unstable to noise. The data string detector controls output amplitude of the pre-circuit-in an analog manner by a method of mixing signals using the delay circuit, but the effects due to correction fluctuate when the delay value of the delay circuit changes as explained above. Furthermore, the method disclosed in JP-A No. H11-345054 cannot be used in the CML that handles differential signals. In the method disclosed in U.S. Pat. No. 6,518,792B2, the configuration of the pre-emphasis circuit is complicated.

As the data string detector, there is an example in which static random access memory (SRAM) is used as a decoder when a data string to be corrected consists of 4 bits, but this example requires writing to the SRAM each time the power source is turned on or off. Moreover, in the methods disclosed in JP-A No. 2002-368600 and JP-A No. H11-345054, the improvement in the amplitude is the prime purpose, and the improvement in the delay time is secondarily performed, which is inadequate control for the waveforms. Particularly, in the method of correcting waveforms and input amplitudes with respect to analog outputs, performance of clock data recovery (CDR) on the reception side may cause an increase in jitter of a recovered clock.

SUMMARY OF THE INVENTION

It is an object of the present invention to provide a technique to suppress degradation in the amplitude of a transmission waveform that is determined depending on a data series.

A transmission signal correction circuit according to an aspect of the present invention includes a first output circuit that outputs a data string to outside; a second output circuit for correction that is connected in parallel with the first output circuit, and captures the data string to add the data string to an output signal of the first output circuit during a period when a-control signal is kept generated; and a data string detection circuit that generates the control signal when detecting a signal sequence, in the data string, that affects a transmission waveform.

A transmission signal correction circuit according to another aspect of the present invention includes a data string detection circuit that generates a control signal when detecting a signal sequence, that affects a transmission waveform, in a data string sent from an internal circuit, the data string being sent to outside; a delay circuit that delays the data string by a predetermined time; an output circuit; and a switch circuit that makes the data string input to the output circuit through the delay circuit when the control signal is not generated, and makes the data string directly input to the output circuit during a period when the control signal is kept generated.

A transmission signal correction circuit according to still another aspect of the present invention includes a data string detection circuit that generates a control signal when detecting a signal sequence, that affects a transmission waveform, in a data string sent from an internal circuit, the data string being sent to outside; a delay circuit that delays the data string by a predetermined time; a first output circuit; a switch circuit that makes the data string input to the first output circuit through the delay circuit when the control signal is not generated, and makes the data string directly input to the first output circuit during a period when the control signal is kept generated; and a second output circuit for correction that is connected in parallel with the first output circuit, and captures the data string to add the data string to an output signal of the first output circuit during a period when the control signal is kept generated.

A transmission signal correction circuit according to still another aspect of the present invention includes a first output circuit that outputs a data string to outside; a plurality of second output circuits for correction that are connected in parallel with the first output circuit, and captures the data string to add the data string to an output signal of the first output circuit during a period when a corresponding control signal is kept generated; and a data string detection circuit that generates the control signal corresponding to a signal sequence when detecting the signal sequence, in the data string, that affects a transmission waveform.

A transmission signal correction circuit according to still another aspect of the present invention includes a data string detection circuit that generates a control signal corresponding to a signal sequence when detecting the signal sequence, that affects a transmission waveform, in a data string sent from an internal circuit, the data string being sent to outside; a plurality of delay circuits that delay the data string by a predetermined time and have mutually different delay values; an output circuit; and a switch circuit that makes the data string input to the output circuit through at least one of the delay circuits when the control signal is not generated, and makes the data string directly input to the output circuit during a period when the control signal is kept generated.

A transmission signal correction circuit according to still another aspect of the present invention includes a data string detection circuit that generates a control signal corresponding to a signal sequence when detecting the signal sequence, that affects a transmission waveform, in a data string sent from an internal circuit, the data string being sent to outside; a plurality of delay circuits that delay the data string by a predetermined time and have mutually different delay values; a first output circuit; a switch circuit that makes the data string input to the first output circuit through at least one of the delay circuits when the control signal is not generated, and makes the data string directly input to the first output-circuit during a period when the control signal is kept generated; and a plurality of second output circuits for correction that is connected in parallel with the first output circuit, and captures the data string to add the data string to an output signal of the first output circuit during a period when a corresponding control signal is kept generated.

The other objects, features, and advantages of the present invention are specifically set forth in or will become apparent from the following detailed description of the invention when read in conjunction with the accompanying drawings.

DETAILED DESCRIPTION

Exemplary embodiments of a transmission signal correction circuit according to the present invention are explained in detail below with reference to the accompanying drawings.

Figure 1:
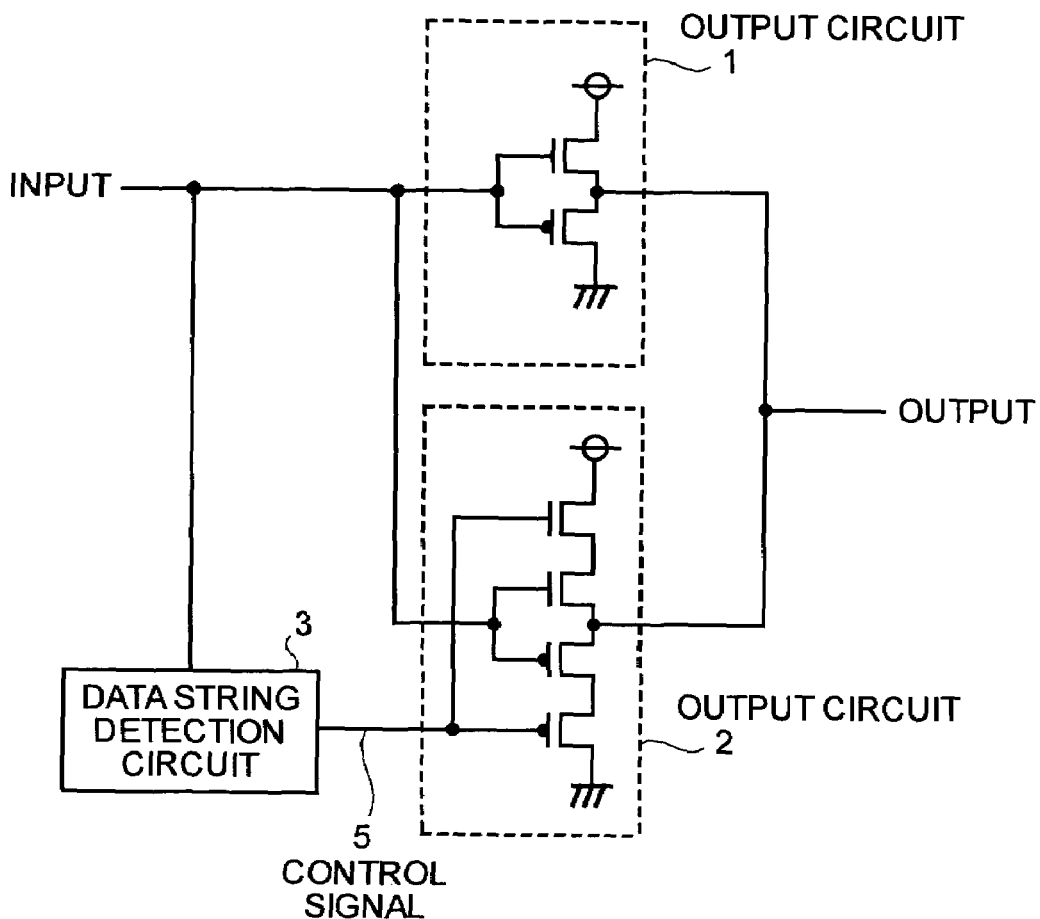
FIG. 1 is a circuit diagram of a transmission signal correction circuit according to a first embodiment of the present invention.

FIG. 1 is a block diagram of a transmission signal correction circuit according to a first embodiment of the present invention. The transmission signal correction circuit includes an output circuit 1 for usual output that outputs a data string sent from an internal circuit to the outside, an output circuit 2 for amplitude correction that is connected in parallel with the output circuit 1, and a data string detection circuit 3 that receives the data string sent from an internal circuit.

When detecting a signal sequence that affects a transmission waveform in the data string, the data string detection circuit 3 outputs a control signal 5 to the output circuit 2. The signal sequence that affects the transmission waveform indicates a signal sequence in which H level continues, or a signal sequence in which L level continues.

The output circuit 2 captures a data string to be input to the output circuit 1 during a period when the control signal 5 is kept generated, and adds the data string to an output signal of the output circuit 1. The loss occurring on a system board is thereby corrected.

Figure 2A:
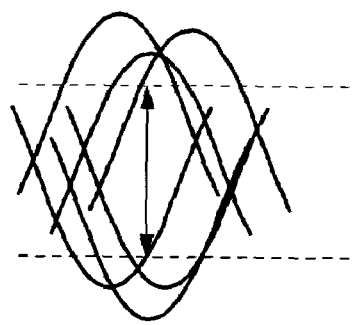
FIG. 2A and FIG. 2B are schematic diagrams of amplitudes before and after correction.
Figure 2B:
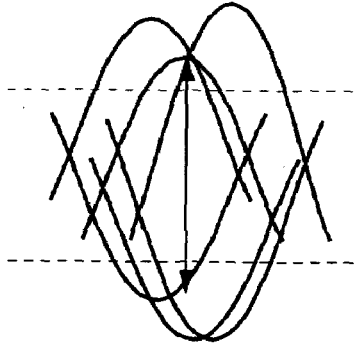

FIG. 2A and FIG. 2B are schematic diagrams of amplitude correcting operations of the transmission signal correction circuit as shown in FIG. 1. FIG. 2A depicts eye patterns before amplitudes are corrected, and FIG. 2B depicts eye patterns after the amplitudes are corrected. When the loss occurs on the system board, the waveforms on the reception side turn into waveforms such that they are compressed in the amplitude direction indicated by arrows of FIG. 2A. Correction to the output amplitude performed on the output side allows the opening of the eye to be increased in the amplitude direction, as shown in FIG. 2B.

This configuration is very simple and still makes it possible to increase the amplitude of the transmission signal and also suppress amplitude degradation of an transmission waveform that is determined depending on a data series. The simple configuration is such that the output circuit for correction is connected in parallel with another output circuit that is usually used, irrespective of whether the output circuit is a CML circuit or a CMOS circuit.

Figure 3:
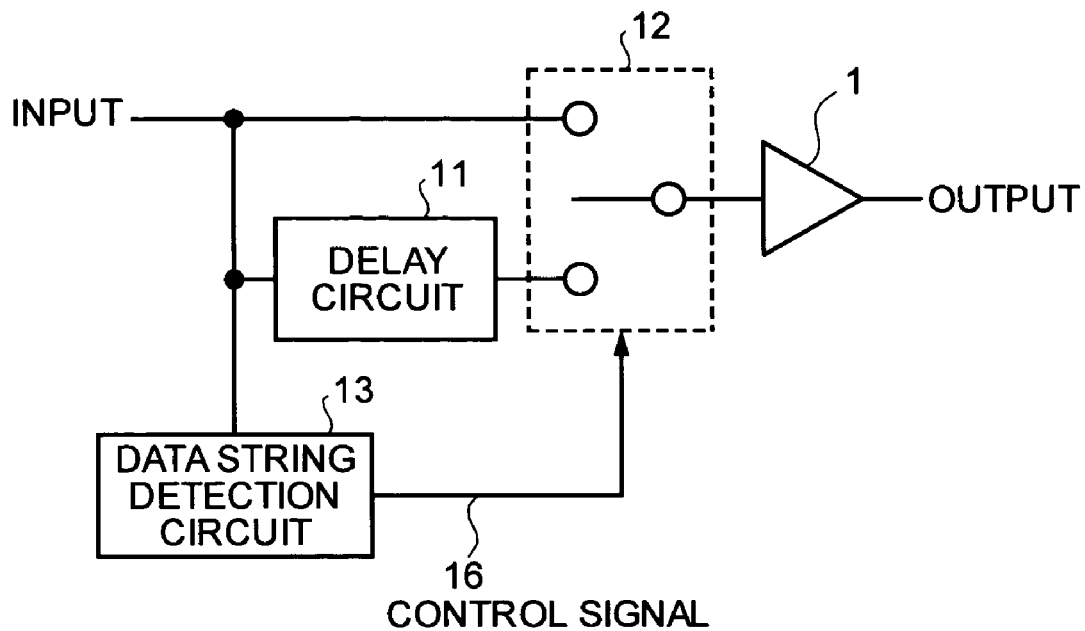
FIG. 3 is a circuit diagram of a transmission signal correction circuit according to a second embodiment of the present invention.

FIG. 3 is a circuit diagram of a transmission signal correction circuit according to a second embodiment of the present invention. The transmission signal correction circuit includes a delay circuit 11, a switch circuit 12, and a data string detection circuit 13, which are provided in an input stage of the output circuit 1 that outputs a data string sent from the internal circuit to the outside.

The delay circuit 11 delays the data string by a predetermined time to output it to one of input terminals of the switch circuit 12. An input to the other input terminal is a data string sent from the internal circuit. A known method of forming a delay circuit such as multistage connection of inverters can be used for the delay circuit 11.

When detecting a signal sequence that affects a transmission waveform in the data string sent from the internal circuit, the data string detection circuit 13 outputs a control signal 16 to the switch circuit 12. The signal sequence that affects the transmission waveform indicates a signal sequence in which H level continues, or a signal sequence in which L level continues.

When the control signal 16 is not generated, in other words, if no signal sequence affecting the transmission waveform is present in the data string sent from the internal circuit, the switch circuit 12 makes the data string input to the output circuit 1 through the delay circuit 11. On the other hand, during a period when the control signal 16 is kept generated, in other words, when a signal sequence affecting the transmission waveform is present in the data string sent from the internal circuit, the switch circuit 12 makes the data string directly input to the output circuit 1 by bypassing the delay circuit 11.

Figure 4A:
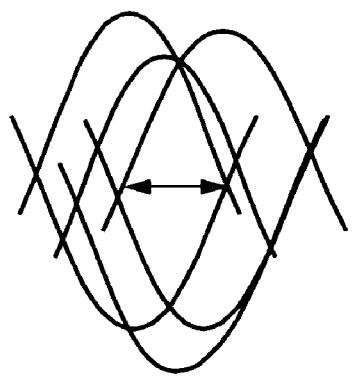
FIG. 4A and FIG. 4B are schematic diagrams of delays before and after correction.
Figure 4B:
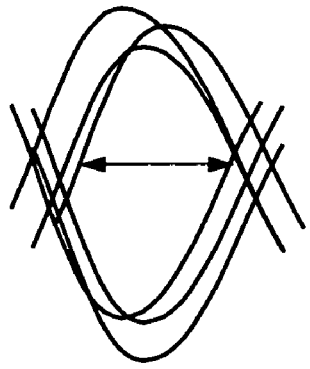

Consequently, the transmission time of the signal sequence that matters can be reduced, which allows a delay time to less fluctuate. FIG. 4A and FIG. 4B are schematic diagrams of delay correcting operations of the transmission signal correction circuit as shown in FIG. 3. FIG. 4A depicts eye patterns before delays are corrected, and FIG. 4B depicts eye patterns after the delays are corrected.

When fluctuations in delay occur, the waveforms on the reception side turn into waveforms such that they fluctuate forward and backward in time as shown in FIG. 4A. By performing delay correction in the above manner, the delays are controlled so that the waveforms having fluctuated forward and backward in time gather as shown in FIG. 4B. Therefore, the central opening of the eye increases, which allows the opening on a time axis to increase.

The correction is performed to the minimum pulse so as to increase the pulse width, and therefore, the amplitude is also improved. If the amplitude correction according to the first embodiment is used for the CMOS circuit, the signal amplitude increases and an output resistance lowers, which may cause change in a through rate of the output signal and fluctuation in the transmission time. However, the second embodiment is configured to avoid these problems.

As explained above, in the second embodiment, a simple configuration makes it possible to reduce fluctuations in the transmission time that are determined depending on a data series. The simple configuration is such that the data string is input to the delay circuit or bypasses the delay circuit, irrespective of whether the output circuit is the CML circuit or the CMOS circuit.

Figure 5:
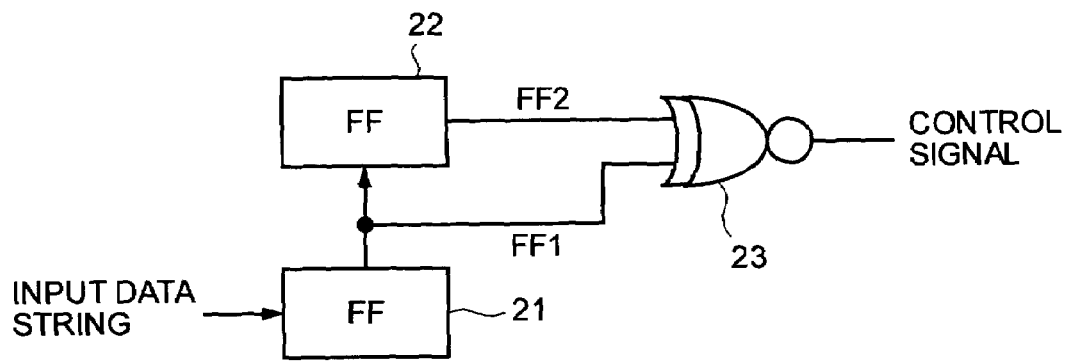
FIG. 5 is a circuit diagram of a data string detection circuit used in a transmission signal correction circuit according to a third embodiment of the present invention.

FIG. 5 is a circuit diagram of a data string detection circuit used in a transmission signal correction circuit according to a third embodiment of the present invention. The data string detection circuit includes two flip-flops (FF) 21 and 22 serially connected to each other, and an XOR circuit 23 that receives the outputs of the flip-flops 21 and 22.

A shift register including the two flip-flops 21 and 22 stores data for the past 2 bits to detect a data pattern. The XOR circuit 23 logically XORs an output state FF1 of the flip-flop 21 with an output state FF2 of the flip-flop 22 to detect whether pieces of the past 2-bit data coincide with each other. If data incoming after the same pieces of data continue by 2 bits has a reverse polarity, the XOR circuit 23 outputs a control signal for instructing correction.

As explained above, in the third embodiment, the data string detection circuit monitors the transmission signal level on the system board, irrespective of whether an output bit line is formed with the CML circuit or the CMOS circuit. If a data bit right after continuous 2 bits of H-level data bits is at L level, the XOR circuit 23 issues the control signal for instructing correction to the data bit at L level. Alternatively, if a data bit right after continuous 2 bits of L-level data bits is at H level, the XOR circuit 23 issues the control signal for instructing correction to the data bit at H level.

In the data string detection circuit, the two flip-flops operate at a synchronous timing, and therefore, operation features do not fluctuate. The data string detection circuit can be commonly used in the first embodiment and the second embodiment, and as explained in a fourth embodiment, a transmission signal correction circuit that performs both amplitude correction and delay correction can be realized with a simple configuration.

Figure 6:
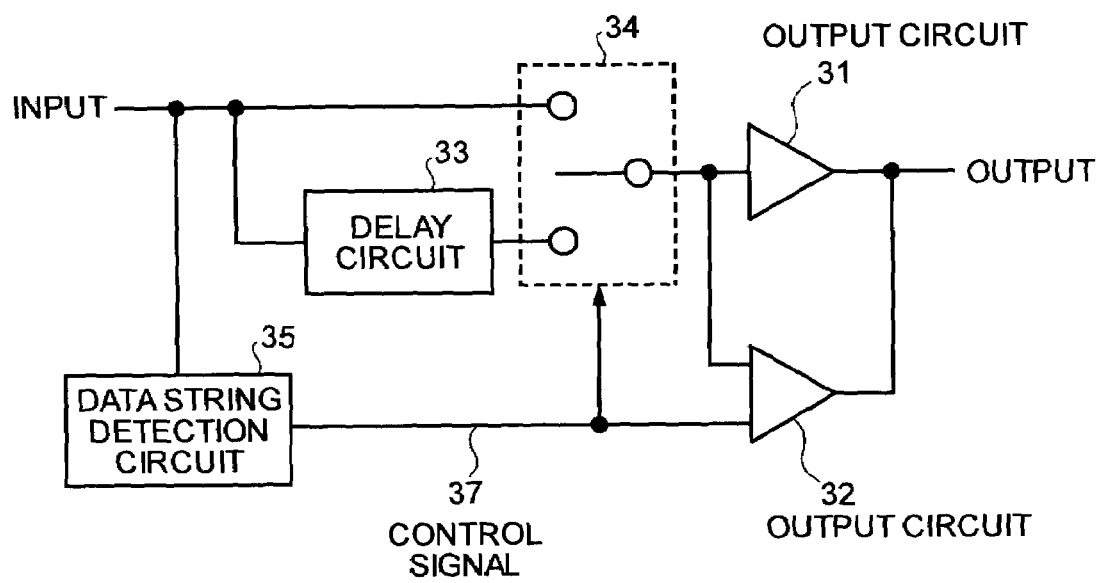
FIG. 6 is a circuit diagram of a transmission signal correction circuit according to a fourth embodiment of the present invention.

FIG. 6 is a circuit diagram of a transmission signal correction circuit according to a fourth embodiment of the present invention. The transmission signal correction circuit is obtained by combining the circuits of the first and the second embodiments. In other words, the transmission signal correction circuit includes an output circuit 31 for usual output, an output circuit 32 for amplitude correction that is connected in parallel with the output circuit 31, a delay circuit 33, a switch circuit 34, and a data string detection circuit 35, which are provided in an input stage of the output circuit 31.

Figure 7:
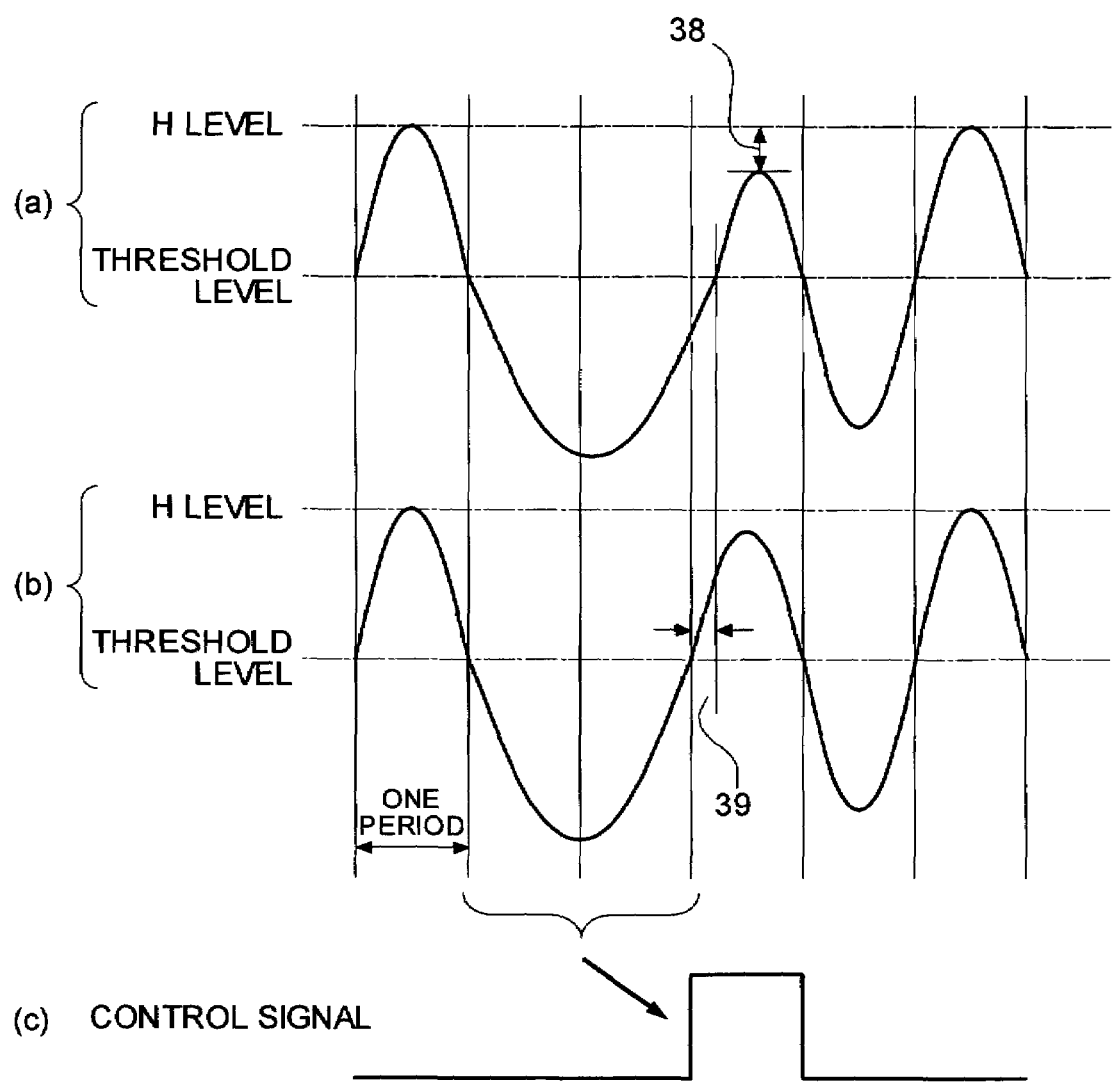
FIG. 7 is a schematic diagram of amplitude and delay correcting operations of the transmission signal correction circuit as shown in FIG. 6.

FIG. 7 is a schematic diagram of amplitude and delay correcting operations of the transmission signal correction circuit as shown in FIG. 6. As shown in FIG. 7, (a) represents a waveform of a signal output to a transmission line in a path through which a data string sent from the internal circuit is input to the output circuit 31 via the delay circuit 33, and a waveform of "HLLHLH" is shown therein.

As shown in (a) of FIG. 7, when a data bit right after continuous 2 bits of L-level data bits is at H level, the amplitude of the data bit at H level lowers by a certain level 38, and the transmission time delay occurs by a certain time 39.

The data string detection circuit 35 makes the data string, which is sent from the internal circuit, input to the output circuit 31 through the delay circuit 33 until "HLL", based on the configuration according to the third embodiment. Because the data bit right after continuous 2 bits of the L-level data bits is at H level, the data string detection circuit 35 outputs the control signal for instructing correction to the data bit at H level ((c) of FIG. 7).

Consequently, the data string sent from the internal circuit is directly input to the output circuit 31 by bypassing the delay circuit 33, and therefore, the data bit that matters is quickly transmitted. As a result, the delay time 39 is corrected as shown in (b) of FIG. 7. Concurrently with this correction, the output circuit 32 performs operation to correct the amplitude 38 having lowered of the data bit that matters.

As explained above, in the fourth embodiment, both the amplitude correction and the delay correction can be concurrently performed with a simple configuration, irrespective of whether the output circuit is the CML circuit or the CMOS circuit. Particularly, if there is data such that fluctuations in the delay time get worse on the reception side caused by correction to the amplitude, the amplitude is reversely corrected by the delay time. Moreover, if fluctuations in the delay time still remain on the reception side, the delay time is corrected again to allow further fine adjustment.

Figure 8:
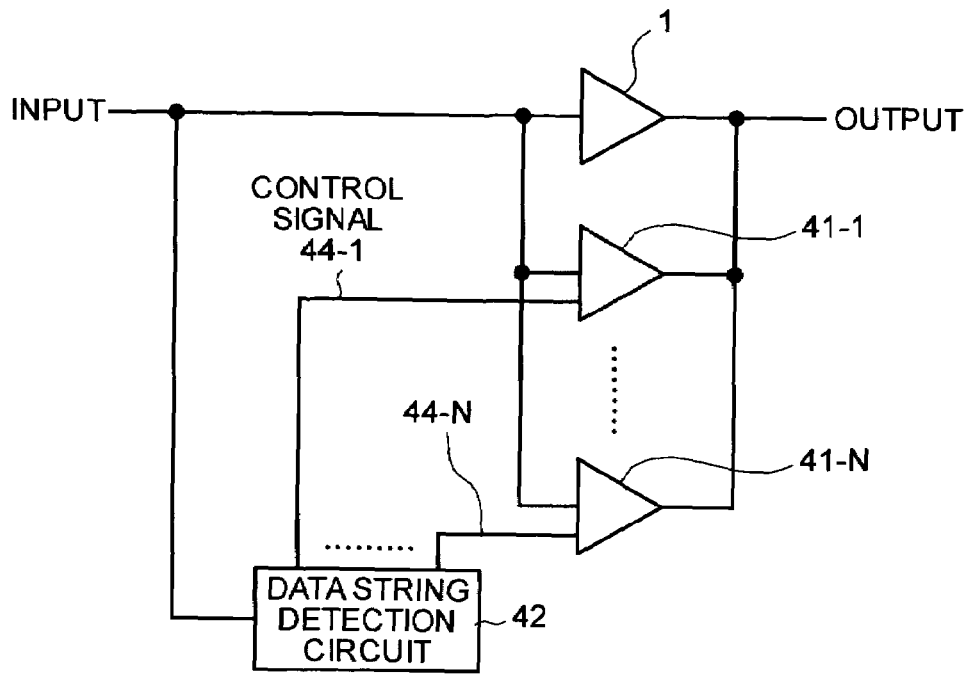
FIG. 8 is a circuit diagram of a transmission signal correction circuit according to a fifth embodiment of the present invention.

FIG. 8 is a circuit diagram of a transmission signal correction circuit according to a fifth embodiment of the present invention. The transmission signal correction circuit includes the output circuit 1 that outputs a data string sent from the internal circuit to the outside, output circuits 41-1 to 41-N for amplitude correction that are connected in parallel with the output circuit 1, and a data string detection circuit 42 that receives a data string sent from the internal circuit. The output circuits 41-1 to 41-N are started by control signals 44-1 to 44-N in a one-to-one correspondence therewith that are output from the data string detection circuit 42.

When detecting a signal sequence that affects a transmission waveform in the data string sent from the internal circuit, the data string detection circuit 42 outputs a control signal according to the signal sequence to a corresponding one of the output circuits 41-1 to 41-N. The signal sequence that affects the transmission waveform indicates a signal sequence in which H level continues, or a signal sequence in which L level continues. The data string detection circuit 42 generates two or more control signals according to the size of a continuous signal sequence and the intervals of its occurrence.

As explained above, in the fifth embodiment, the amplitude correction can be performed over N-stages, which makes it possible to perform finer amplitude correction according to a data series.

Figure 9:
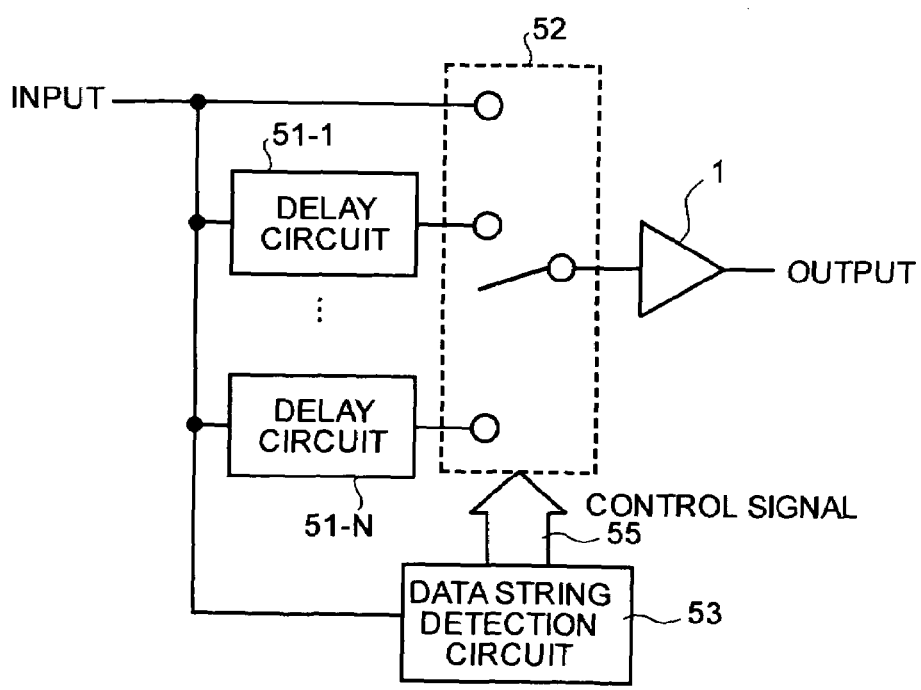
FIG. 9 is a circuit diagram of a transmission signal correction circuit according to a sixth embodiment of the present invention.

FIG. 9 is a circuit diagram of a transmission signal correction circuit according to a sixth embodiment of the present invention. The transmission signal correction circuit includes delay circuits 51-1 to 51-N, a switch circuit 52, and a data string detection circuit 53, which are provided in an input stage of the output circuit 1 that outputs a data string sent from the internal circuit to the outside.

The delay circuits 51-1 to 51-N are configured to have different delay values. When detecting a signal sequence that affects a transmission waveform in the data string sent from the internal circuit, the data string detection circuit 53 outputs a control signal according to the signal sequence to the switch circuit 52.

The signal sequence that affects the transmission waveform indicates a signal sequence in which H level continues, or a signal sequence in which L level continues. The data string detection circuit 53 generates two or more control signals according to the size of a continuous signal sequence and the intervals of its occurrence. The switch circuit 52 can thereby control the number of delay circuits to be provided to two or more.

As explained above, in the sixth embodiment, the delay correction can be performed over N-stages, which makes it possible to perform finer correction to time fluctuations according to a data series.

Figure 10:
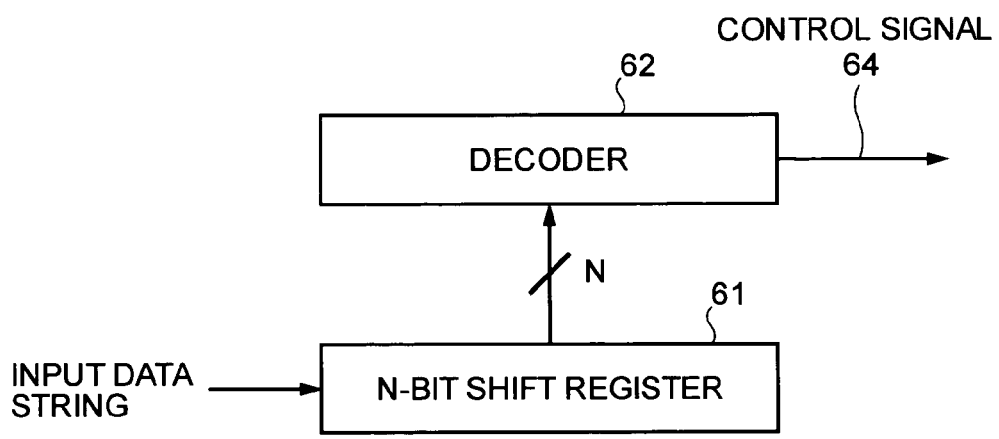
FIG. 10 is a circuit diagram of a data string detection circuit used in a transmission signal correction circuit according to a seventh embodiment of the present invention.

FIG. 10 is a circuit diagram of a data string detection circuit used in a transmission signal correction circuit according to a seventh embodiment of the present invention. The data string detection circuit includes an N-bit shift register 61 and a decoder 62.

The N-bit shift register 61 stores data for the past N bits to perform most appropriate correction corresponding to 2N-bit patterns, respectively. The decoder 62 decodes the data string stored in the N-bit shift register to output a control signal 64.

Therefore, by using the data string detection circuit according to the seventh embodiment, it is possible to realize the transmission signal correction circuit that performs fine correcting operations using a difference between bit strings. One of examples of the transmission signal correction circuit is shown in an eighth embodiment. It is noted that the SRAM is not used as the decoder, and therefore, a control signal can be generated at power-up. In other words, in the transmission signal correction circuit using the data string detection circuit according to the seventh embodiment, an appropriate correcting operation can be performed at power-up.

Figure 11:
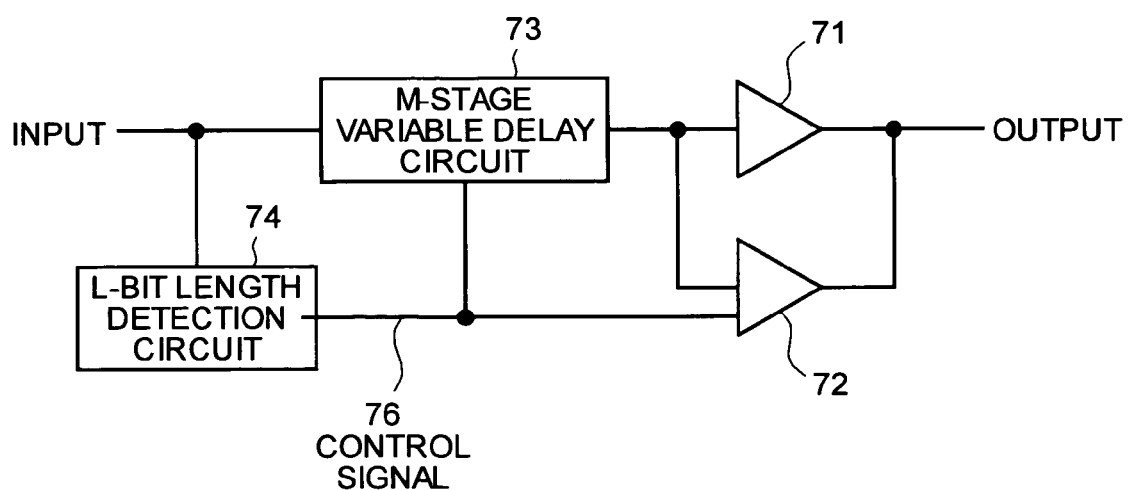
FIG. 11 is a circuit diagram of a transmission signal correction circuit according to an eighth embodiment of the present invention.

FIG. 11 is a circuit diagram of a transmission signal correction circuit according to an eighth embodiment of the present invention. This transmission signal correction circuit includes an output circuit 71 for usual output, an output circuit 72 for N-gradation amplitude correction connected in parallel with the output circuit 71, an M-stage variable delay circuit 73 provided in an input stage of the output circuit 71, and an L-bit length detection circuit 74 that controls these circuits.

The output circuit 72 is configured in the same manner as that of the output circuits 41-1 to 41-N as explained in the fifth embodiment. The M-stage variable delay circuit 73 is configured in the same manner as that of the delay circuits 51-1 to 51-N and the switch circuit 52 as explained in the sixth embodiment. The L-bit length detection circuit 74 is configured in the same manner as that of the data string detection circuit as explained in the seventh embodiment. The L-bit length detection circuit 74 may be configured to match a larger one of N and M when N is not equal to M.

In the eighth embodiment, the data pattern is detected over an L-bit length, which makes it possible to perform more accurate correction.

Figure 12:
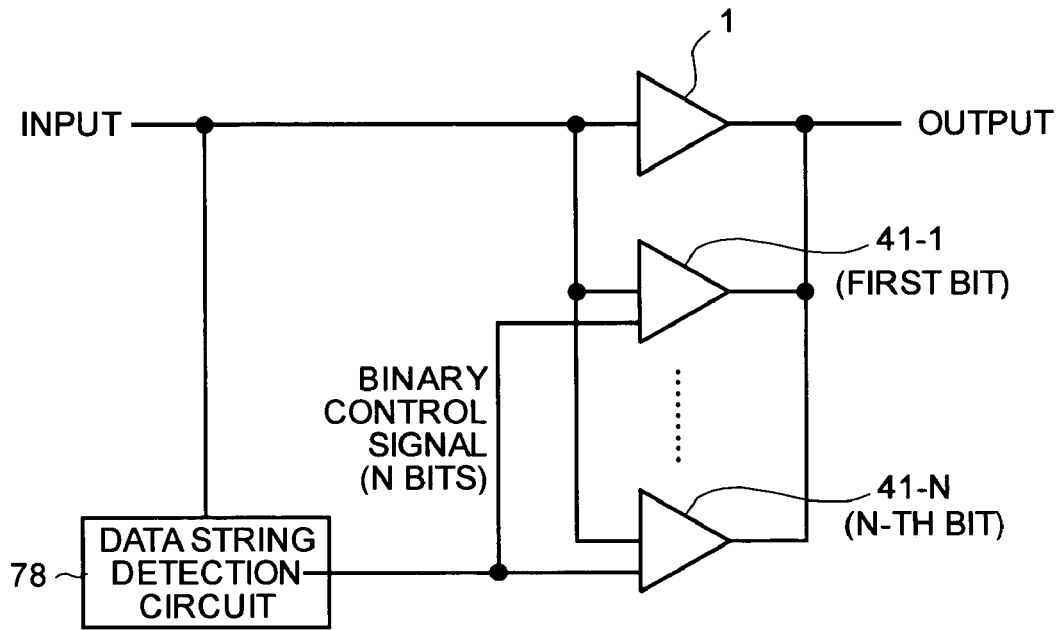
FIG. 12 is a circuit diagram of a transmission signal correction circuit according to a ninth embodiment of the present invention.

FIG. 12 is a circuit diagram of a transmission signal correction circuit according to a ninth embodiment of the present invention. This transmission signal correction circuit includes a data string detection circuit 78 instead of the data string detection circuit 42 based on the transmission signal correction circuit as shown in FIG. 8 (fifth embodiment).

The data string detection circuit 78 generates an N-bit binary control signal corresponding to a signal sequence when the signal sequence that affects a transmission waveform is detected in a data string sent from the internal circuit.

The output circuits 41-1 to 41-N are provided in a one-to-one correspondence with bits of the N-bit binary control signal generated by the data string detection circuit 78 to operate according to a logic state of a corresponding bit.

As explained above, in the ninth embodiment, finer amplitude correction can be performed according to a data series in the same manner as that of the fifth embodiment. In addition, the interconnect for the control signal can be reduced.

Figure 13:
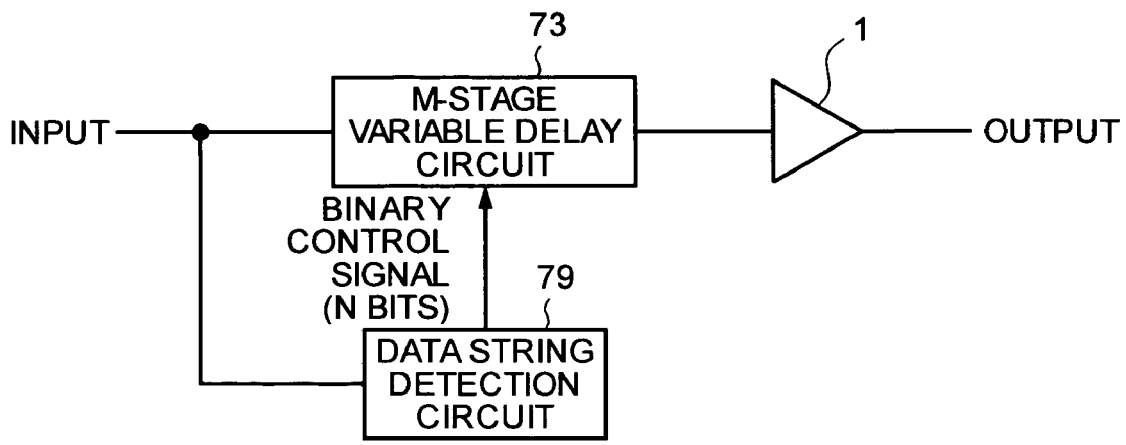
FIG. 13 is a circuit diagram of a transmission signal correction circuit according to a tenth embodiment of the present invention.

FIG. 13 is a circuit diagram of a transmission signal correction circuit according to a tenth embodiment of the present invention. This transmission signal correction circuit includes a data string detection circuit 79 instead of the data string detection circuit 53 based on the transmission signal correction circuit as shown in FIG. 9 (sixth embodiment). The M-stage variable delay circuit 73 is configured in the same manner as that of the delay circuits 51-1 to 51-N and the switch circuit 52 as explained in the sixth embodiment.

The data string detection circuit 79 generates an N-bit binary control signal corresponding to a signal sequence when the signal sequence that affects a transmission waveform is detected in a data string sent from the internal circuit. The M-stage variable delay circuit 73 is thereby possible to control the number of delay circuits to be provided to two or more.

As explained above, in the tenth embodiment, finer correction to time fluctuations can be performed according to a data series in the same manner as that of the sixth embodiment. In addition, the interconnect for the control signal can be reduced.

Figure 14:
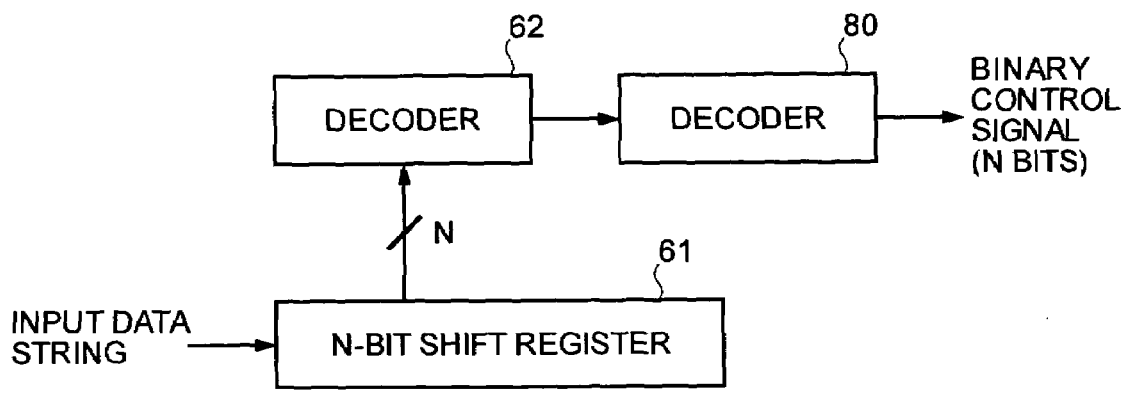
FIG. 14 is a circuit diagram of a data string detection circuit used in a transmission signal correction circuit according to an eleventh embodiment of the present invention.

FIG. 14 is a circuit diagram of a data string detection circuit used in a-transmission signal correction circuit according to an eleventh embodiment of the present invention. This transmission signal correction circuit includes a decoder 80 that receives the output of the decoder 62 and outputs a binary control signal based on the transmission signal correction circuit as shown in FIG. 10 (seventh embodiment).

This configuration makes it possible to realize a transmission signal correction circuit that can perform finer correcting operation using a difference of bit strings.

Figure 15:
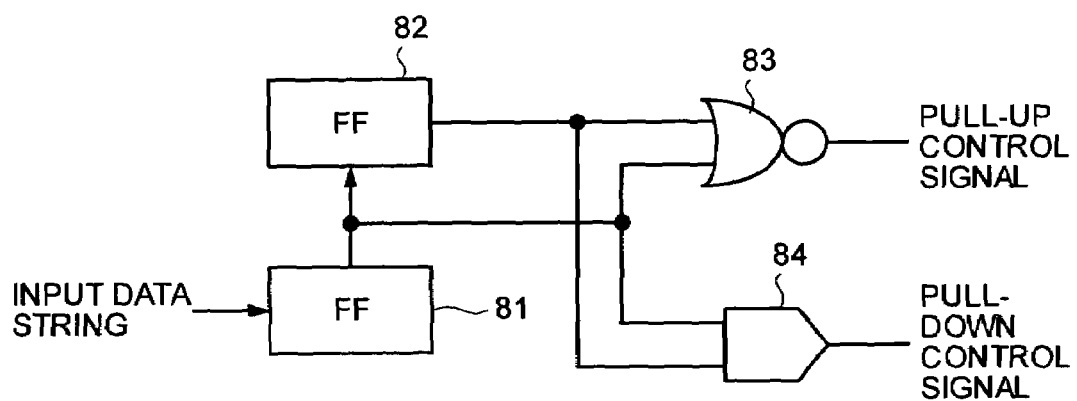
FIG. 15 is a circuit diagram of a data string detection circuit used in a transmission signal correction circuit according to a twelfth embodiment of the present invention.

FIG. 15 is a circuit diagram of a data string detection circuit used in a transmission signal correction circuit according to a twelfth embodiment of the present invention. In this embodiment, a case where a pattern of "HH" and a pattern of "LL" are discretely detected is exemplified assuming that the data string detection circuit is used in the CMOS circuit.

In other words, the data string detection circuit as shown in FIG. 15 includes two flip-flops 81 and 82 serially connected to each other, and a NOR circuit 83 and an AND circuit 84 each of which receives the outputs of the two flip-flops 81 and 82.

A shift register including the two flip-flops 81 and 82 stores data for the past 2 bits to detect a data pattern. The NOR circuit 83 logically NORs the outputs of the two flip-flops 81 and 82 to thereby detect that "L" is continuous, and generates a pull-up control signal. The AND circuit 84 logically ANDs the outputs of the two flip-flops 81 and 82 to thereby detect that "H" is continuous, and generates a pull-down control signal.

For example, if the output circuits 1 and 2 as explained in the first embodiment (FIG. 1) include respective CMOS circuits, the CMOS circuit forming the output circuit 2 is configured not to commonly connect the gate electrodes of a p-type metal oxide semiconductor (PMOS) transistor and an n-type metal oxide semiconductor (NMOS) transistor but to separate them from each other. The pull-up control signal is provided to the gate electrode of the PMOS transistor, and the pull-down control signal is provided to the gate electrode of the NMOS transistor. This configuration is also used in the fifth embodiment (FIG. 8).

In the twelfth embodiment, if the output circuit includes the CMOS circuit, the data string detection circuit can be arranged close to a pull-up circuit and a pull-down circuit in its layout, which makes it possible to reduce an error in operation timing due to the interconnect.

Figure 16:
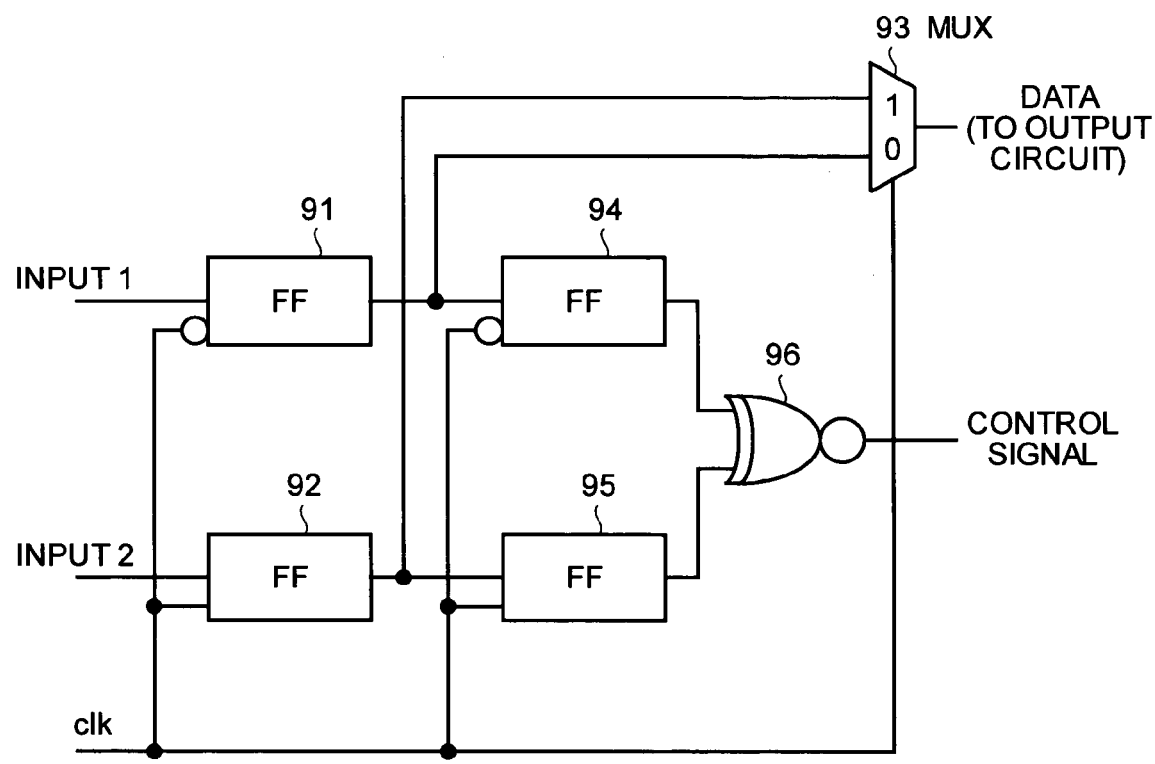
FIG. 16 is a circuit diagram of a data string detection circuit used in a transmission signal correction circuit according to a thirteenth embodiment of the present invention.

FIG. 16 is a circuit diagram of a data string detection circuit used in a transmission signal correction circuit according to a thirteenth embodiment of the present invention. This embodiment provides an example of configuration of the data string detection circuit used in the transmission signal correction circuit that is compatible with a double data rate (DDR) system for achieving efficiency in data transfer using both edges of a clock.

In other words, as shown in FIG. 16, a flip-flop (FF) 91 captures a first data string (input 1), which is sent from the internal circuit, on the falling edge of a clock clk to provide it to one of two input terminals of a multiplex circuit (MUX) 93. A flip-flop (FF) 92 captures a second data string (input 2), which is sent from the internal circuit, on the rising edge of the clock clk to provide it to the other input terminal of the multiplex circuit 93. The multiplex circuit 93 multiplexes both the data strings input according to the clock clk to output the data strings multiplexed to an output circuit.

The data string detection circuit in the transmission signal correction circuit used on the transmission side of the DDR system may include a flip-flop (FF) 94 that captures the output of the flip-flop 91 on the falling edge of the clock clk, a flip-flop (FF) 95 that captures the output of the flip-flop 92 on the rising edge of the clock clk, and an XOR circuit 96 that receives the outputs of the flip-flops 94 and 95.

In this data string detection circuit, the data for the past 2 bits is latched into the flip-flops 94 and 95 in the same manner as that of the data string detection circuit as explained in the third embodiment (FIG. 5). The XOR circuit 96 logically XORs an output state of the flip-flop 94 with an output state of the flip-flop 95, and detects whether the pieces of the data for the past 2 bits are coincident. If data after continuous 2 bits in the same data has a reverse polarity, the XOR circuit 96 outputs a control signal for instructing correction.

Therefore, the thirteenth embodiment can provide the transmission signal correction circuit capable of performing the amplitude correction explained in the first embodiment (FIG. 1) and the transmission time correction explained in the second embodiment (FIG. 3) on the transmission side of the DDR system, irrespective of whether the output circuit is the CML circuit or the CMOS circuit.

Figure 17:
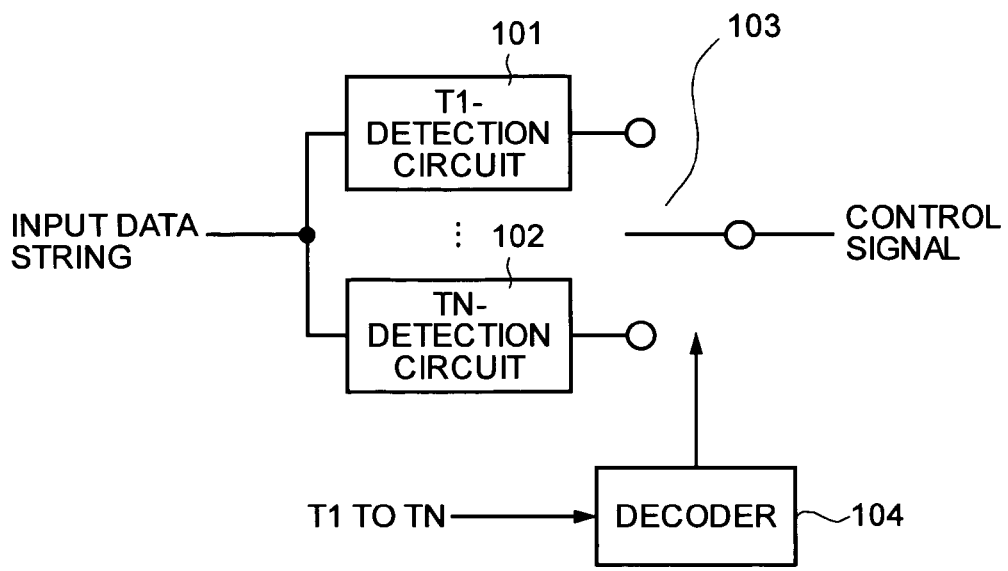
FIG. 17 is a circuit diagram of a data string detection circuit used in a transmission signal correction circuit according to a fourteenth embodiment of the present invention.

FIG. 17 is a circuit diagram of a data string detection circuit used in a transmission signal correction circuit according to a fourteenth embodiment of the present invention. This embodiment provides an example of configuration of the data string detection circuit used in a case where the DDR system as explained in the thirteenth embodiment (FIG. 16) uses N-phase clocks.

In other words, the data string detection circuit as shown in FIG. 17 includes N pieces of the data string detection circuits (a T1-detection circuit 101 to a TN-detection circuit 102) each explained in the thirteenth embodiment (FIG. 16), and a decoder 104 that receives N-phase clocks T1 to TN. The data string detection circuit also includes a switch circuit 103 that selects one of N pieces of control signals output from the T1-detection circuit 101 to the TN-detection circuit 102 according to the output of the decoder 104, and outputs the control signal selected.

Figure 18:
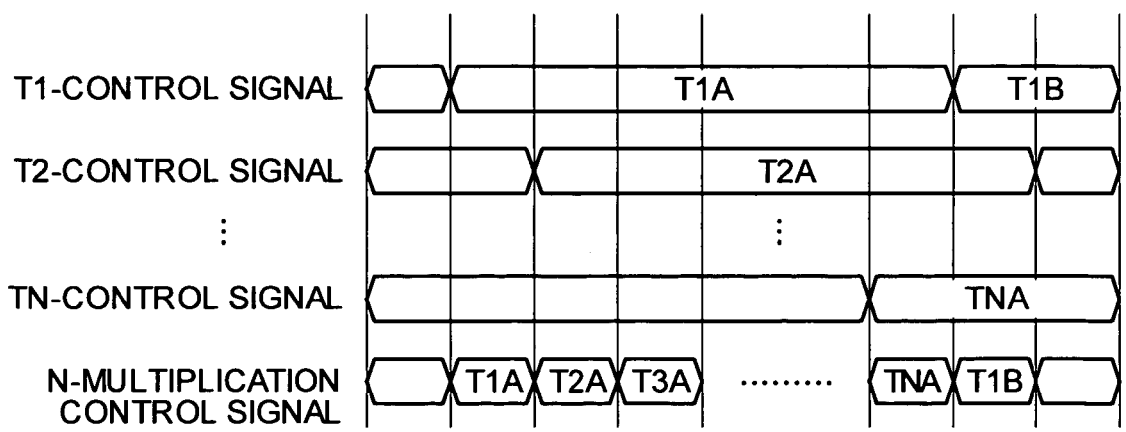
FIG. 18 is a time chart for explaining operations of the data string detection circuit as shown in FIG. 17.

FIG. 18 is a time chart for explaining operations of the data string detection circuit shown in FIG. 17. The N pieces of the data string detection circuits (the T1-detection circuit 101 to the TN-detection circuit 102) generate a T1-control signal, a T2-control signal, . . . , a TN-control signal according to the clocks (T1 to TN), respectively. The control signals are latched over respective clock cycles and output.

The switch circuit 103 operates at a speed obtained by multiplying a clock (T1 to TN) by N, and selects each control signal based on an output of the decoder 104 to output the control signal selected (N-multiplication control signal).

Therefore, the fourteenth embodiment can provide the transmission signal correction circuit capable of performing the amplitude correction explained in the first embodiment (FIG. 1) and the transmission time correction explained in the second embodiment (FIG. 3) on the transmission side of the DDR system in the case of using N-phase clocks, irrespective of whether the output circuit is the CML circuit or the CMOS circuit.

Figure 19:
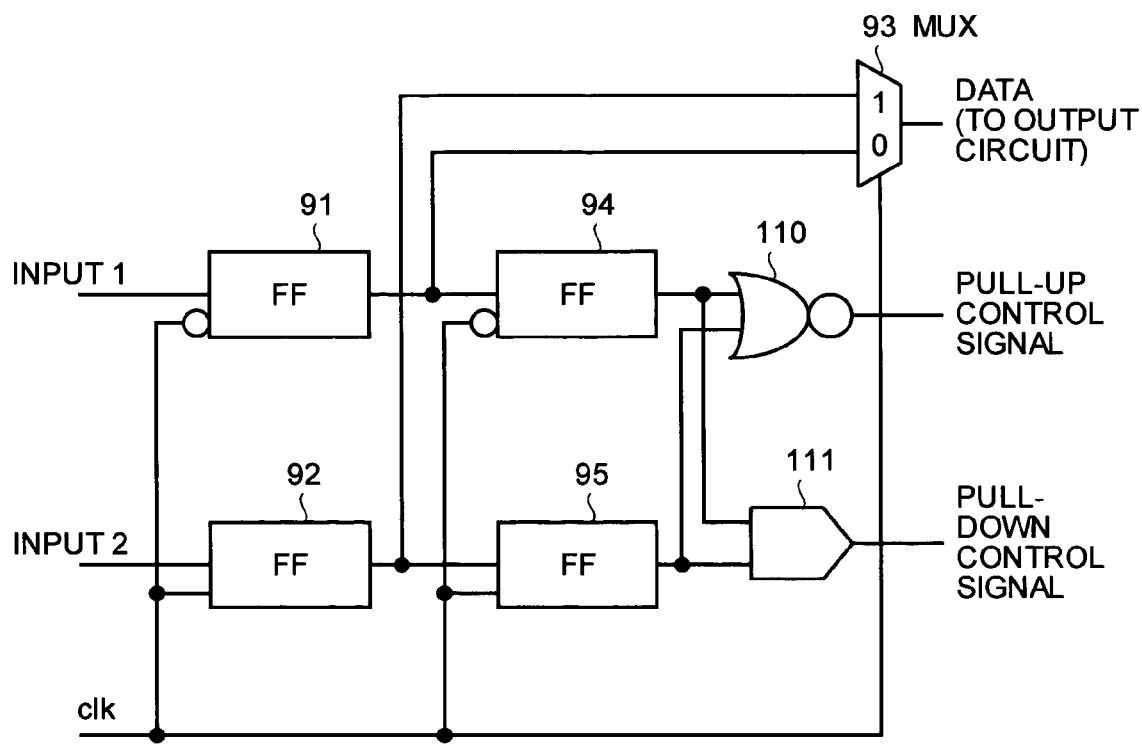
FIG. 19 is a circuit diagram of a data string detection circuit used in a transmission signal correction circuit according to a fifteenth embodiment of the present invention.
Figure 20:
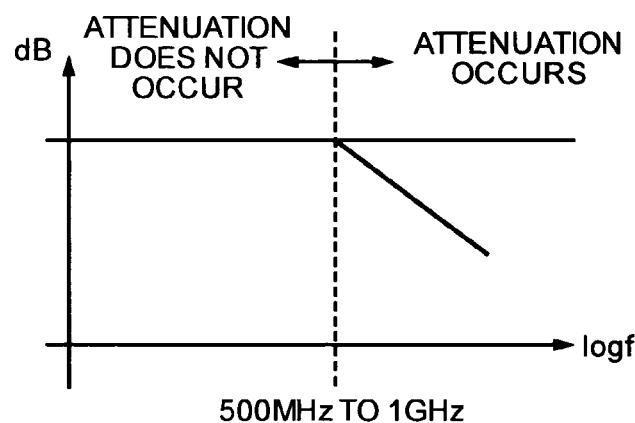
FIG. 20 is a conceptual diagram of attenuation characteristics of substrate interconnect.
Figure 21:
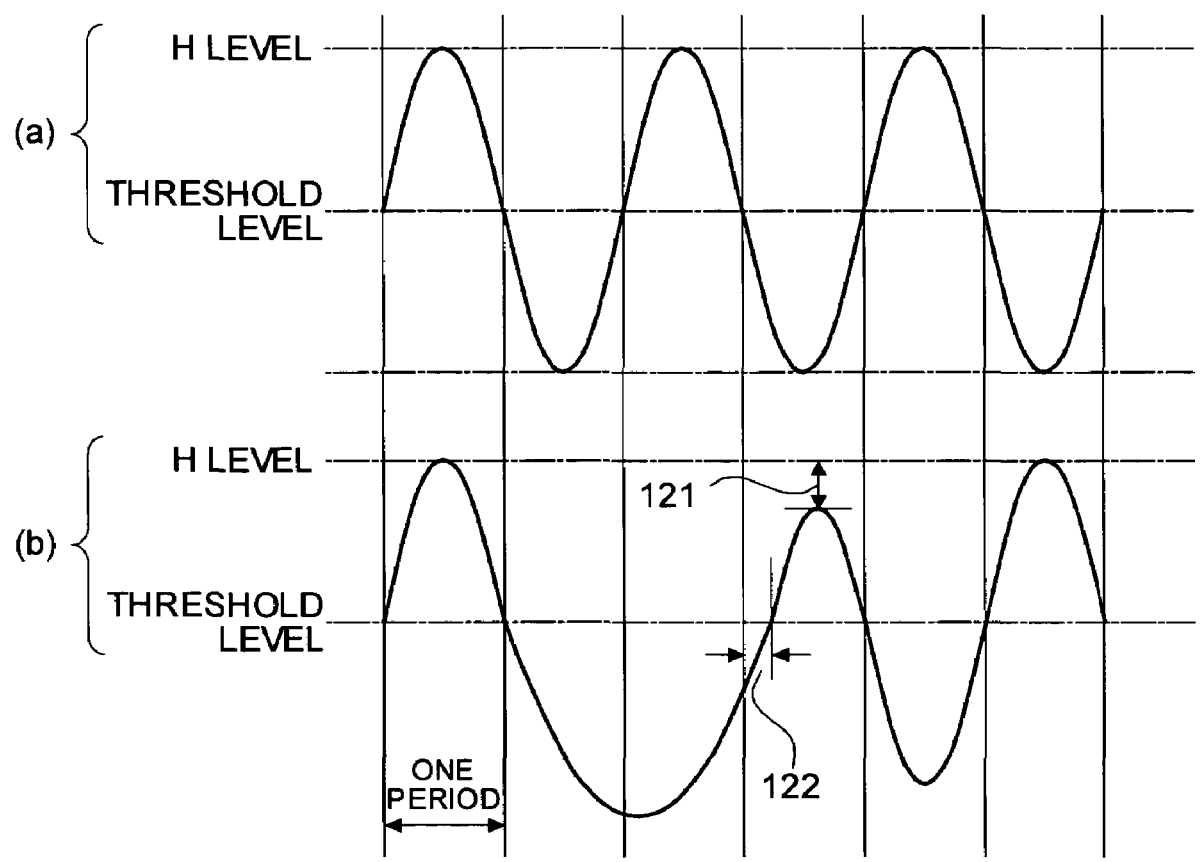
FIG. 21 is a conceptual diagram of digital signal waveforms transmitted through the substrate interconnect.
Figure 22:
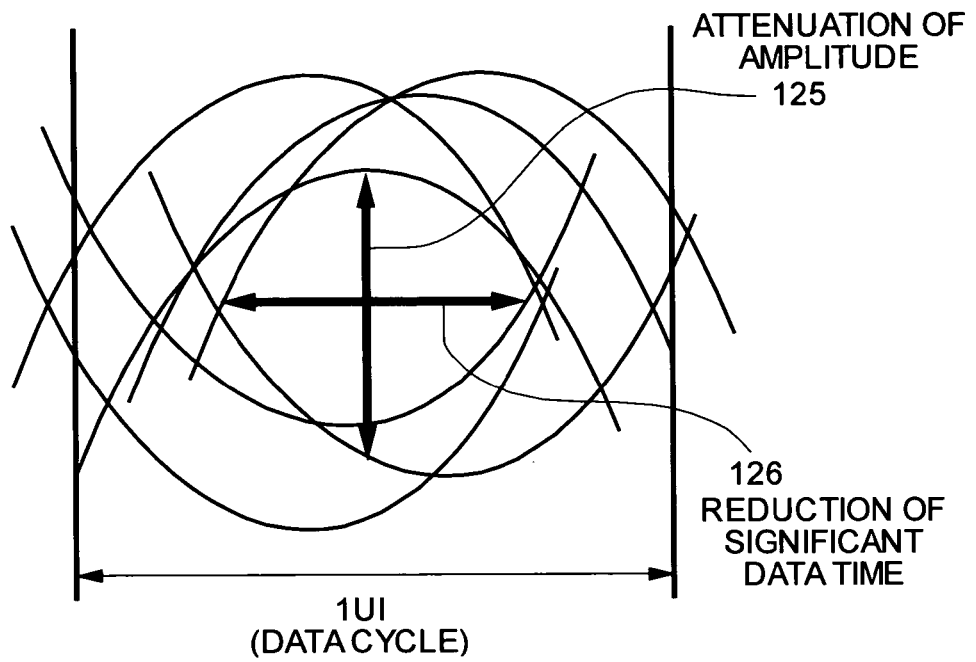
FIG. 22 is a conceptual diagram of reduced eye patterns due to the ISI.
Figure 23:
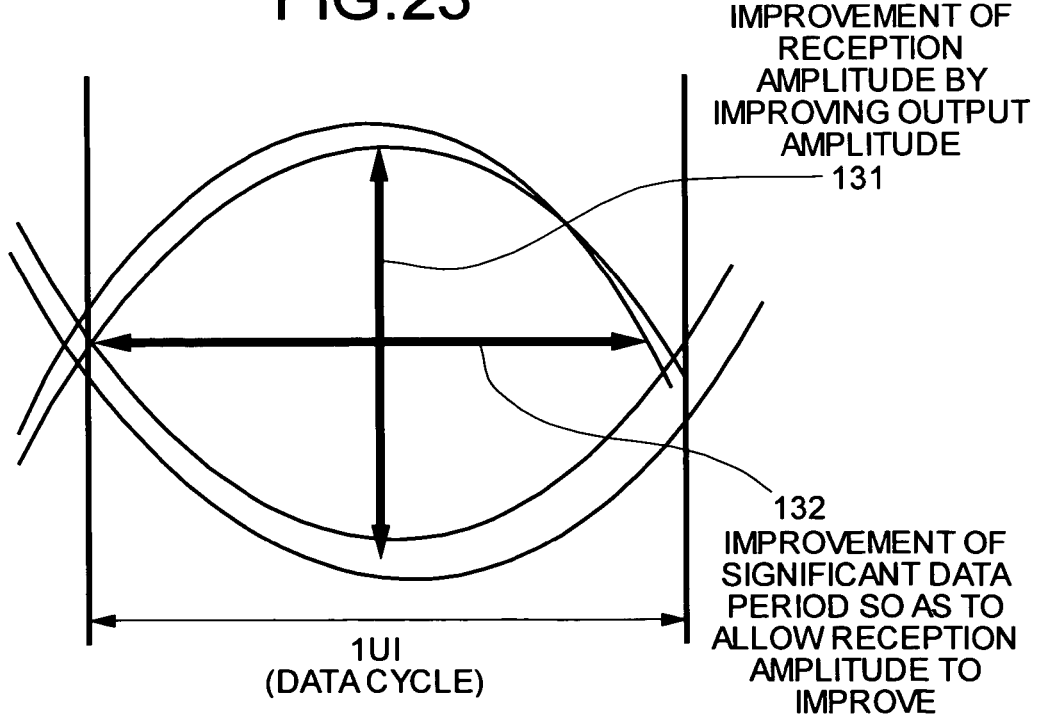
FIG. 23 is a diagram of obtained effects when waveforms are controlled on their transmission side.
Figure 24:
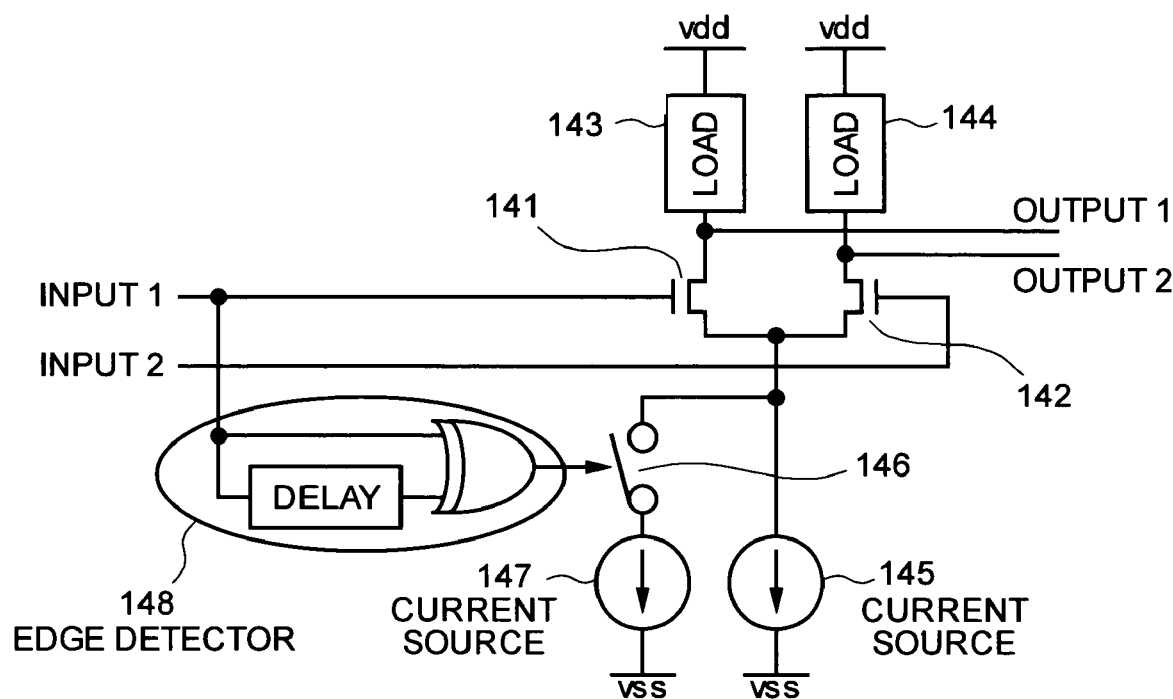
FIG. 24 is a schematic diagram of a conventional method of controlling waveforms (Part 1)
Figure 25:
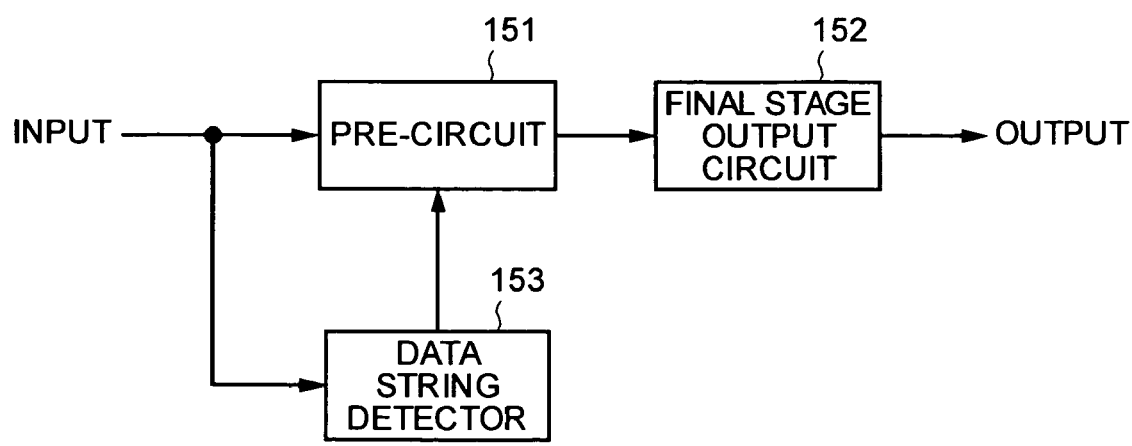
FIG. 25 is a schematic diagram of another conventional method of controlling waveforms (Part 2).

FIG. 19 is a circuit diagram of a data string detection circuit used in a transmission signal correction circuit according to a fifteenth embodiment of the present invention. In this embodiment, an example of configuration of the data string detection circuit that discretely detects a pattern of "HH" and a pattern of "LL" is explained assuming that a circuit realizing the DDR system as explained in the thirteenth embodiment (FIG. 16) is the CMOS circuit.

In other words, the data string detection circuit as shown in FIG. 19 includes a NOR circuit 110 and an AND circuit 111, instead of the XOR circuit 96 based on the data string detection circuit as explained in the thirteenth embodiment (FIG. 16), each of which receives the outputs of the two flip-flops 94 and 95.

The NOR circuit 110 logically NORs the outputs of the two flip-flops 94 and 95 to thereby detect that "L" is continuous, and generates a pull-up control signal. The AND circuit 111 logically ANDs the outputs of the two flip-flops 94 and 95 to thereby detect that "H" is continuous, and generates a pull-down control signal.

As explained in the twelfth embodiment (FIG. 15), the pull-up control signal is provided to the gate electrode of the PMOS transistor, and the pull-down control signal is provided to the gate electrode of the NMOS transistor.

Therefore, in the fifteenth embodiment, if the output circuit includes the CMOS circuit, the data string detection circuit can be arranged close to a pull-up circuit and a pull-down circuit in its layout, which makes it possible to reduce an error in operation timing due to the interconnect.

According to the present invention, the transmission signal correction circuit includes the first output circuit that outputs a data string to the outside, and the second output circuit for correction that is connected in parallel with the first output circuit. When a signal sequence that affects a transmission waveform is present in the data string to be transmitted, the transmission signal correction circuit operates the second output circuit to cause the output amplitude of the first output circuit to increase. Therefore, it is possible to suppress the degradation in the amplitude of a transmission waveform that is determined depending on a data series.

Moreover, when a signal sequence that affects a transmission waveform is not present in the data string to be transmitted, the transmission signal correction circuit provides the data string to the output circuit through the delay circuit, and directly provides the data string to the output circuit by bypassing the delay circuit when a signal sequence that affects a transmission waveform is present in the data string to be transmitted. As a result, fluctuations in the transmission time determined depending on a data series are suppressed to allow reception of the data string on the reception side in a state where the transmission time less fluctuates. It is noted that these measures can be applied to the output circuit irrespective of whether it is the CML circuit or the CMOS circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A transmission signal correction circuit, comprising:
a first output circuit that outputs a data string to outside;
a second output circuit for correction that is connected in parallel with the first output circuit, and captures the data string to add the data string to an output signal of the first output circuit during a period when a control signal is kept generated; and
a data string detection circuit that generates the control signal when detecting a signal sequence, in the data string, that affects a transmission waveform, wherein
the data string detection circuit generates the control signal when a data string to be sent out to the outside is obtained by multiplexing a first data string captured on a rising edge of a clock and a second data string captured on a falling edge of the clock, and when detecting a signal sequence that affects a transmission waveform, in the data string multiplexed, and
the data string detection circuit includes
  a first flip-flop that sequentially captures bits of the first data string;
  a second flip-flop that sequentially captures bits of the second data string; and
  an exclusive OR circuit that receives outputs of the two flip-flops, and generates the control signal when a noncoincidence occurs between the outputs after they coincide with each other.

2. The transmission signal correction circuit according to claim 1, wherein the data string detection circuit is provided in each clock in N-phase, and a control signal is output from a corresponding one of N pieces of the data string detection circuit according to a clock used.

3. A transmission signal correction circuit, comprising:
a data string detection circuit that generates a control signal when detecting a signal sequence, that affects a transmission waveform, in a data string sent from an internal circuit, the data string being sent to outside;
a delay circuit that delays the data string by a predetermined time;
an output circuit; and
a switch circuit that makes the data string input to the output circuit through the delay circuit when the control signal is not generated, and makes the data string directly input to the output circuit during a period when the control signal is kept generated, wherein
the data string detection circuit includes
two flip-flops that are serially connected to each other, and sequentially capture bits of the data string to output the bits, respectively; and
an exclusive OR circuit that receives outputs of the two flip-flops, and generates the control signal when a noncoincidence occurs between the outputs after they coincide with each other.

4. A transmission signal correction circuit, comprising:
a data string detection circuit that generates a control signal when detecting a signal sequence, that affects a transmission waveform, in a data string sent from an internal circuit, the data string being sent to outside;
a delay circuit that delays the data string by a predetermined time;
an output circuit; and
a switch circuit that makes the data string input to the output circuit through the delay circuit when the control signal is not generated, and makes the data string directly input to the output circuit during a period when the control signal is kept generated, wherein
the data string detection circuit generates the control signal when a data string to be sent out to the outside is obtained by multiplexing a first data string captured on a rising edge of a clock and a second data string captured on a falling edge of the clock, and when detecting a signal sequence that affects a transmission waveform, in the data string multiplexed, and
the data string detection circuit includes
  a first flip-flop that sequentially captures bits of the first data string;
  a second flip-flop that sequentially captures bits of the second data string; and
  an exclusive OR circuit that receives outputs of the two flip-flops, and generates the control signal when a noncoincidence occurs between the outputs after they coincide with each other.

5. The transmission signal correction circuit according to claim 4, wherein the data string detection circuit is provided in each clock in N-phase, and a control signal is output from a corresponding one of N pieces of the data string detection circuit according to a clock used.

6. A transmission signal correction circuit, comprising:
a data string detection circuit that generates a control signal when detecting a signal sequence, that affects a transmission waveform, in a data string sent from an internal circuit, the data string being sent to outside;
a delay circuit that delays the data string by a predetermined time;
a first output circuit;
a switch circuit that makes the data string input to the first output circuit through the delay circuit when the control signal is not generated, and makes the data string directly input to the first output circuit during a period when the control signal is kept generated; and
a second output circuit for correction that is connected in parallel with the first output circuit, and captures the data string to add the data string to an output signal of the first output circuit during a period when the control signal is kept generated.

7. The transmission signal correction circuit according to claim 6, wherein the data string detection circuit includes
two flip-flops that are serially connected to each other, and sequentially capture bits of the data string to output the bits, respectively; and
an exclusive OR circuit that receives outputs of the two flip-flops, and generates the control signal when a noncoincidence occurs between the outputs after they coincide with each other.

8. The transmission signal correction circuit according to claim 6, wherein the second output circuit includes
a p-type metal-oxide-semiconductor transistor; and
an n-type metal-oxide-semiconductor transistor serially connected to the p-type metal-oxide-semiconductor transistor, and
the data string detection circuit includes
two flip-flops that are serially connected to each other, and sequentially capture bits of the data string to output the bits, respectively; and
a logic circuit that outputs the control signal to cause the p-type metal-oxide-semiconductor transistor to perform on-operation when outputs of the two flip-flops received are at low level, and to cause the n-type metal-oxide-semiconductor transistor to perform on-operation when the outputs are at high level.

9. The transmission signal correction circuit according to claim 6, wherein the data string detection circuit generates the control signal when a data string to be sent out to the outside is obtained by multiplexing a first data string captured on a rising edge of a clock and a second data string captured on a falling edge of the clock, and when detecting a signal sequence that affects a transmission waveform, in the data string multiplexed, and
the data string detection circuit includes
a first flip-flop that sequentially captures bits of the first data string;
a second flip-flop that sequentially captures bits of the second data string; and
an exclusive OR circuit that receives outputs of the two flip-flops, and generates the control signal when a noncoincidence occurs between the outputs after they coincide with each other.

10. The transmission signal correction circuit according to claim 9, wherein the data string detection circuit is provided in each clock in N-phase, and a control signal is output from a corresponding one of N pieces of the data string detection circuit according to a clock used.

11. The transmission signal correction circuit according to claim 6, wherein the second output circuit includes
a p-type metal-oxide-semiconductor transistor; and
an n-type metal-oxide-semiconductor transistor serially connected to the p-type metal-oxide-semiconductor transistor, and
the data string detection circuit includes
a first flip-flop that sequentially captures bits of the first data string;
a second flip-flop that sequentially captures bits of the second data string; and
a logic circuit that outputs the control signal to cause the p-type metal-oxide-semiconductor transistor to perform on-operation when outputs of the two flip-flops received are at low level, and to cause the n-type metal-oxide-semiconductor transistor to perform on-operation when the outputs are at high level.

12. The transmission signal correction circuit according to claim 11, wherein the data string detection circuit is provided in each clock in N-phase, and a control signal is output from a corresponding one of N pieces of the data string detection circuit according to a clock used.

13. A transmission signal correction circuit, comprising:
a first output circuit that outputs a data string to outside;
a plurality of second output circuits for correction that are connected in parallel with the first output circuit, and captures the data string to add the data string to an output signal of the first output circuit during a period when a corresponding control signal is kept generated; and
a data string detection circuit that generates the control signal corresponding to a signal sequence when detecting the signal sequence, in the data string, that affects a transmission waveform, wherein
the data string detection circuit includes
a shift register that stores the past two or more bits; and
a binary code signal generation circuit that generates a binary code signal indicating the control signal from a plurality of bits as outputs of the shift register.

14. A transmission signal correction circuit, comprising:
a data string detection circuit that generates a control signal corresponding to a signal sequence when detecting the signal sequence, that affects a transmission waveform, in a data string sent from an internal circuit, the data string being sent to outside;
a plurality of delay circuits that delay the data string by a predetermined time and have mutually different delay values;
an output circuit; and
a switch circuit that makes the data string input to the output circuit through at least one of the delay circuits when the control signal is not generated, and makes the data string directly input to the output circuit during a period when the control signal is kept generated, wherein
the data string detection circuit includes
a shift register that stores the past two or more bits; and
a decoder that decodes a plurality of bits as outputs of the shift register and generates the control signal.

15. A transmission signal correction circuit, comprising:
a data string detection circuit that generates a control signal corresponding to a signal sequence when detecting the signal sequence, that affects a transmission waveform, in a data string sent from an internal circuit, the data string being sent to outside;
a plurality of delay circuits that delay the data string by a predetermined time and have mutually different delay values;
an output circuit; and
a switch circuit that makes the data string input to the output circuit through at least one of the delay circuits when the control signal is not generated, and makes the data string directly input to the output circuit during a period when the control signal is kept generated, wherein
the data string detection circuit includes
a shift register that stores the past two or more bits; and
a binary code signal generation circuit that generates a binary code signal indicating the control signal from a plurality of bits as outputs of the shift register.

16. A transmission signal correction circuit, comprising:
a data string detection circuit that generates a control signal corresponding to a signal sequence when detecting the signal sequence, that affects a transmission waveform, in a data string sent from an internal circuit, the data string being sent to outside;

a plurality of delay circuits that delay the data string by a predetermined time and have mutually different delay values;
a first output circuit;
a switch circuit that makes the data string input to the first output circuit through at least one of the delay circuits when the control signal is not generated, and makes the data string directly input to the first output circuit during a period when the control signal is kept generated; and
a plurality of second output circuits for correction that is connected in parallel with the first output circuit, and captures the data string to add the data string to an output signal of the first output circuit during a period when a corresponding control signal is kept generated.

17. The transmission signal correction circuit according to claim 16, wherein the data string detection circuit includes
a shift register that stores the past two or more bits; and
a decoder that decodes a plurality of bits as outputs of the shift register and generates the control signal.

18. The transmission signal correction circuit according to claim 16, wherein the data string detection circuit includes
a shift register that stores the past two or more bits; and
a binary code signal generation circuit that generates a binary code signal indicating the control signal from a plurality of bits as outputs of the shift register.

* * * * *